(12) United States Patent
Suzuki

(10) Patent No.: US 12,148,644 B2
(45) Date of Patent: Nov. 19, 2024

(54) LASER IRRADIATION APPARATUS

(71) Applicant: JSW AKTINA SYSTEM CO., LTD, Yokohama (JP)

(72) Inventor: Yuki Suzuki, Yokohama (JP)

(73) Assignee: JSW AKTINA SYSTEM CO., LTD, Yokohama (JP)

( * ) Notice: Subject to any disclaimer, the term of this patent is extended or adjusted under 35 U.S.C. 154(b) by 12 days.

(21) Appl. No.: 18/195,069

(22) Filed: May 9, 2023

(65) Prior Publication Data

US 2023/0274964 A1 Aug. 31, 2023

Related U.S. Application Data

(62) Division of application No. 16/321,017, filed as application No. PCT/JP2017/021216 on Jun. 7, 2017, now Pat. No. 11,688,622.

(30) Foreign Application Priority Data

Aug. 29, 2016 (JP) .................................. 2016-166962

(51) Int. Cl.
*H01L 21/677* (2006.01)
*B23K 26/00* (2014.01)
(Continued)

(52) U.S. Cl.
CPC .... *H01L 21/67784* (2013.01); *B23K 26/0006* (2013.01); *B23K 26/083* (2013.01); *B23K 26/12* (2013.01); *B23K 26/354* (2015.10); *B65G 49/05* (2013.01); *B65G 49/065* (2013.01); *B65G 53/02* (2013.01); *C03B 25/02* (2013.01); *C03C 17/30* (2013.01); *H01L 21/268* (2013.01); *H01L 21/67115* (2013.01); *H01L 21/6776* (2013.01);
(Continued)

(58) Field of Classification Search
CPC .............. H01L 21/67784; B23K 6/354; B23K 26/0006
USPC .................. 438/458, 795; 219/121.6, 121.18
See application file for complete search history.

(56) References Cited

U.S. PATENT DOCUMENTS

| 2009/0111244 A1* | 4/2009 | Yamazaki ........... H01L 27/1214 257/E21.568 |
| 2009/0181552 A1 | 7/2009 | Shimomura et al. |
| 2013/0038649 A1 | 2/2013 | Lowrance et al. |

FOREIGN PATENT DOCUMENTS

| CN | 101409221 A | 4/2009 |
| JP | 2002-231654 A | 8/2002 |

(Continued)

OTHER PUBLICATIONS

Machine Translation of JP2011225355 (Year: 2024).*

(Continued)

*Primary Examiner* — Nathaniel E Wiehe
*Assistant Examiner* — Thomas J Ward
(74) *Attorney, Agent, or Firm* — Potomac Law Group, PLLC

(57) ABSTRACT

In a laser irradiation apparatus 1 according to one embodiment, each of first and second flotation units 30a, 30b includes a base 31, and a porous plate 32 bonded to an upper surface of the base 31 by an adhesive layer 34, the base 31 includes a rising portion 312 protruding upward at an outer periphery facing at least the gap, and the porous plate 32 includes a cutout portion 321 configured to fit to the rising portion 312, and the adhesive layer 34 is formed along an inner wall of the rising portion 312 having fitted to the cutout portion 321.

7 Claims, 17 Drawing Sheets

(51) Int. Cl.
- *B23K 26/08* (2014.01)
- *B23K 26/12* (2014.01)
- *B23K 26/354* (2014.01)
- *B65G 49/05* (2006.01)
- *B65G 49/06* (2006.01)
- *B65G 53/02* (2006.01)
- *C03B 25/02* (2006.01)
- *C03C 17/30* (2006.01)
- *H01L 21/268* (2006.01)
- *H01L 21/67* (2006.01)

(52) U.S. Cl.
CPC .... *B65G 2249/04* (2013.01); *B65G 2249/045* (2013.01); *C03C 2218/32* (2013.01)

(56) References Cited

FOREIGN PATENT DOCUMENTS

| | | | | |
|---|---|---|---|---|
| JP | 2006135083 | * 11/2004 | ........... | H01L 21/677 |
| JP | 2006-135083 A | 5/2006 | | |
| JP | 2006-327715 A | 12/2006 | | |
| JP | 2008-110852 A | 5/2008 | | |
| JP | 2009-117552 A | 5/2009 | | |
| JP | 2009-135430 A | 6/2009 | | |
| JP | 2009-161283 A | 7/2009 | | |
| JP | 2009-194370 A | 8/2009 | | |
| JP | 2011-225355 A | 11/2011 | | |
| JP | 2011225355 | * 11/2011 | ............... | H01L 2/66 |
| JP | 2013-251524 A | 12/2013 | | |
| JP | 5512052 B2 | 6/2014 | | |
| WO | 2013/136411 A1 | 9/2013 | | |

OTHER PUBLICATIONS

Machine Translation of JP2006135083 (Year: 2024).*
Office Action issued Nov. 9, 2022, in Chinese Patent Application No. 201780052577.9.
International Search Report from International Patent Application No. PCT/JP2017/021216, Aug. 15, 2017.

* cited by examiner

LASER IRRADIATION APPARATUS

TECHNICAL FIELD

The present invention relates to a laser irradiation apparatus. More particularly, the present invention relates to, for example, a laser irradiation apparatus which irradiates a workpiece of a plate shape with a laser beam while floating and conveying the workpiece.

BACKGROUND ART

There is a known laser irradiation apparatus which irradiates a workpiece of a plate shape with a laser beam while floating and conveying the workpiece.

By the way, Patent Literatures 1 and 2 disclose techniques of floating workpieces of plate shapes by blowing gases upward from horizontally set porous plates. In this regard, the porous plates are bonded to bases by adhesives as disclosed in Patent Literatures 1 and 2.

CITATION LIST

Patent Literature

PTL 1: Japanese Unexamined Patent Application Publication No. 2008-110852
PTL 2: Japanese Patent No. 5512052

SUMMARY OF INVENTION

Technical Problem

The inventors have found various problems while developing a laser irradiation apparatus which irradiates a workpiece of a plate shape with a laser beam while floating and conveying the workpiece.

Other problems to be solved by and novel features of the present invention will become apparent from the following description and the drawings.

Solution to Problem

In a laser irradiation apparatus according to one embodiment, each of first and second flotation units includes a base, and a porous plate bonded to an upper surface of the base by an adhesive layer, the base includes a rising portion protruding upward at an outer periphery facing at least the gap, and the porous plate includes a cutout portion configured to fit to the rising portion, and the adhesive layer is formed along an inner wall of the rising portion having fitted to the cutout portion.

In a laser irradiation apparatus according to another embodiment, a gas is suctioned through a plurality of first through-holes formed in a porous plate and a plurality of second through-holes formed in an intermediate plate made of a metal, and diameters of a plurality of first through-holes are larger than diameters of a plurality of second through-holes.

Advantageous Effects of Invention

According to the one embodiment, it is possible to provide a good laser irradiation apparatus which is suitable to a laser annealing apparatus, for example.

DESCRIPTION OF EMBODIMENTS

Specific embodiments will be described in detail below with reference to the drawings. In this regard, the embodiments are not limited to the following embodiments. Furthermore, the following description and drawings are simplified as appropriate for clarification of description.

First Embodiment

Entire Configuration of Laser Irradiation Apparatus

Figure 1:
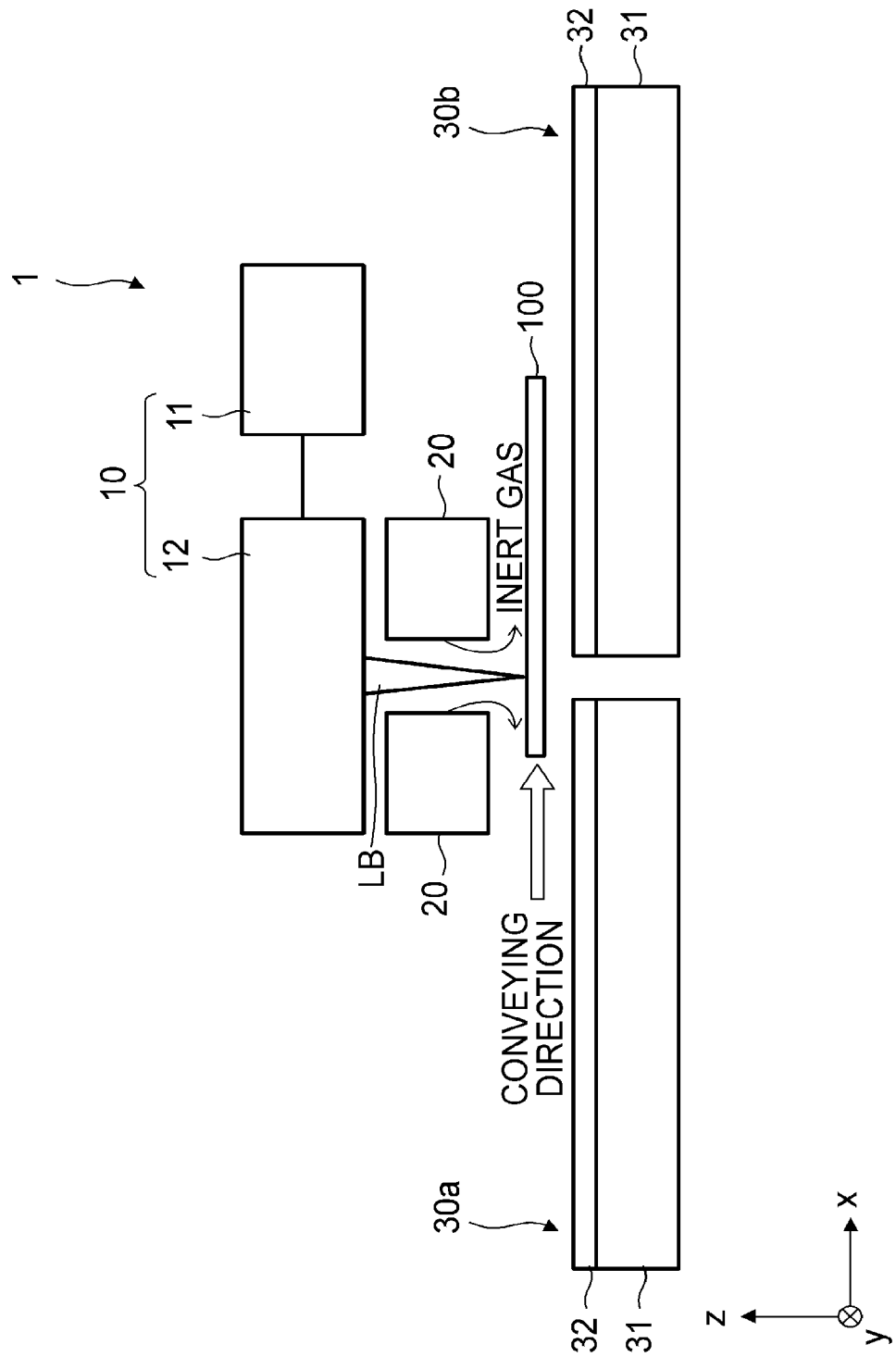
FIG. 1 is a schematic cross-sectional view illustrating an outline of the laser irradiation apparatus according to the first embodiment.

First, an entire configuration of a laser irradiation apparatus according to the first embodiment will be described with reference to FIG. 1. FIG. 1 is a schematic cross-sectional view illustrating an outline of the laser irradiation apparatus according to the first embodiment. The laser irradiation apparatus according to the first embodiment is suitable to an excimer annealing apparatus which irradiates an amorphous silicon film formed on a glass substrate with a laser beam to polycrystallize. Alternatively, the laser irradiation apparatus according to the first embodiment is also applicable to a laser release apparatus which irradiates a release layer formed on a glass substrate with a laser beam from a substrate side and releases the release layer.

As illustrated in FIG. 1, a laser irradiation apparatus 1 according to the first embodiment includes a laser irradiation unit 10, local seal units 20 and flotation units 30a and 30b. The laser irradiation apparatus 1 according to the first embodiment irradiates a plate-shaped workpiece 100 such as a glass substrate with a laser beam LB while floating and conveying the workpiece 100.

In addition, a right-handed xyz coordinate is illustrated in FIG. 1 for ease of description of a positional relationship between components. Generally, an xy plane is a horizontal plane, and a z axis plus direction faces an upper side in a vertical direction.

The laser irradiation unit 10 includes a laser oscillator 11 and an optical system module 12. The laser oscillator 11 is a laser light source, and is an ultraviolet ray laser oscillator such as an excimer laser or a solid laser. Laser light generated by the laser oscillator 11 is introduced in the optical system module 12 formed by a lens and a mirror. The laser beam LB emitted from the optical system module 12 is condensed on the floated and conveyed plate-shaped workpiece 100. In addition, as described below with reference to FIG. 2, the laser beam LB is a line beam whose y axis direction is a longitudinal direction on the plate-shaped workpiece 100.

The local seal units 20 are provided to surround the laser beam LB on a lower side of the optical system module 12. The local seal units 20 blow an inert gas such as a nitrogen gas toward an irradiation region of the laser beam LB on the plate-shaped workpiece 100. Consequently, it is possible to prevent oxidation of a silicon film annealed by the laser beam LB on the plate-shaped workpiece 100, for example. In addition, the local seal units 20 are not indispensable.

The flotation units 30a and 30b are horizontally installed plate-shaped members, and blow a gas upward from upper surfaces to horizontally float the plate-shaped workpiece 100. The flotation units 30a and 30b float the plate-shaped workpiece 100 by approximately 200 μm, for example. The flotation units 30a and 30b are disposed at a predetermined interval to align in a conveying direction (x axis direction) of the plate-shaped workpiece 100. A gap between the flotation unit (e.g., first flotation unit) 30a and the flotation unit (e.g., second flotation unit) 30b is irradiated with the laser beam LB.

The flotation units 30a and 30b each include a base 31 and a porous plate 32. The porous plate 32 is applied to an upper surface of the base 31 of a plate shape. The base 31 is a plate member made of a metal such as aluminum or stainless steel. A pressurized gas is introduced in the base 31, and this gas passes fine pores (i.e., small cavities) inside the porous plate 32 and is blown from an upper surface of the porous plate 32.

The porous plate 32 faces the plate-shaped workpiece 100 while the plate-shaped workpiece 100 is conveyed.

The porous plate 32 is made of a porous ceramic, a porous carbon or a porous metal, for example. The carbon is concerned to be ground due to contact with the plate-shaped workpiece 100 during use, or generate particles in the irradiation region of the laser beam LB. Furthermore, the porous carbon is costly. Hence, it is preferable to use a cheap ceramic which is hardly ground or hardly generates particles. For example, an alumina ceramic whose pore diameter is 0.1 to 50 μm (preferably 1 to 10 μm) and whose porosity is 10 to 60% (preferably 35 to 45%).

Figure 2:
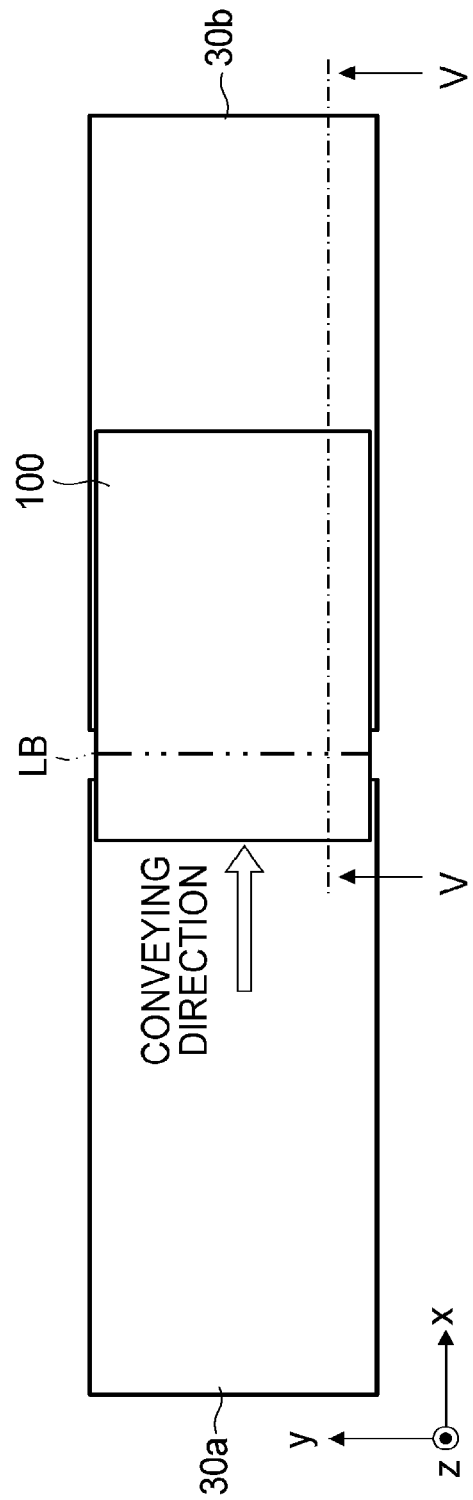
FIG. 2 is a plan view illustrating the positional relationship between the flotation units 30*a* and 30*b* and the plate-shaped workpiece 100.

Hereinafter, a positional relationship between the flotation units 30a and 30b and the plate-shaped workpiece 100 in a plan view will be described with reference to FIG. 2. FIG. 2 is a plan view illustrating the positional relationship between the flotation units 30a and 30b and the plate-shaped workpiece 100. Furthermore, FIG. 2 illustrates the laser beam LB on the plate-shaped workpiece 100 as a dashed-two dotted line. In addition, the right-handed system xyz coordinate illustrated in FIG. 2 matches with FIG. 1.

As illustrated in FIG. 2, the flotation units 30a and 30b each have a planar shape of a rectangular shape. In the example in FIG. 2, the conveying direction (x axis direction) of the plate-shaped workpiece 100 matches with a longitudinal direction of the flotation units 30a and 30b, and they axis direction matches with a width direction of the flotation units 30a and 30b.

As described above, the laser beam LB is a line beam whose y axis direction is the longitudinal direction, and is irradiated on the gap between the flotation units 30a and 30b. The length in they axis direction of the laser beam LB is, for example, equal to or less than the length in the y axis direction of the plate-shaped workpiece 100 (i.e., the width of the plate-shaped workpiece 100). Although an irradiation position of the laser beam LB is fixed, the plate-shaped workpiece 100 is conveyed in an x axis plus direction. Consequently, it is possible to irradiate the entire surface of the plate-shaped workpiece 100 with the laser beam LB. In addition, instead of irradiating the entire surface of the plate-shaped workpiece 100 while the plate-shaped workpiece 100 is conveyed once, the entire surface of the plate-shaped workpiece 100 may be irradiated with the laser beam LB a plurality of times while the plate-shaped workpiece 100 is conveyed multiple times. Furthermore, the entire surface of the plate-shaped workpiece 100 does not necessarily need to be irradiated with the laser beam LB.

Flotation Unit According to Comparative Example 1 of First Embodiment

Figure 3:
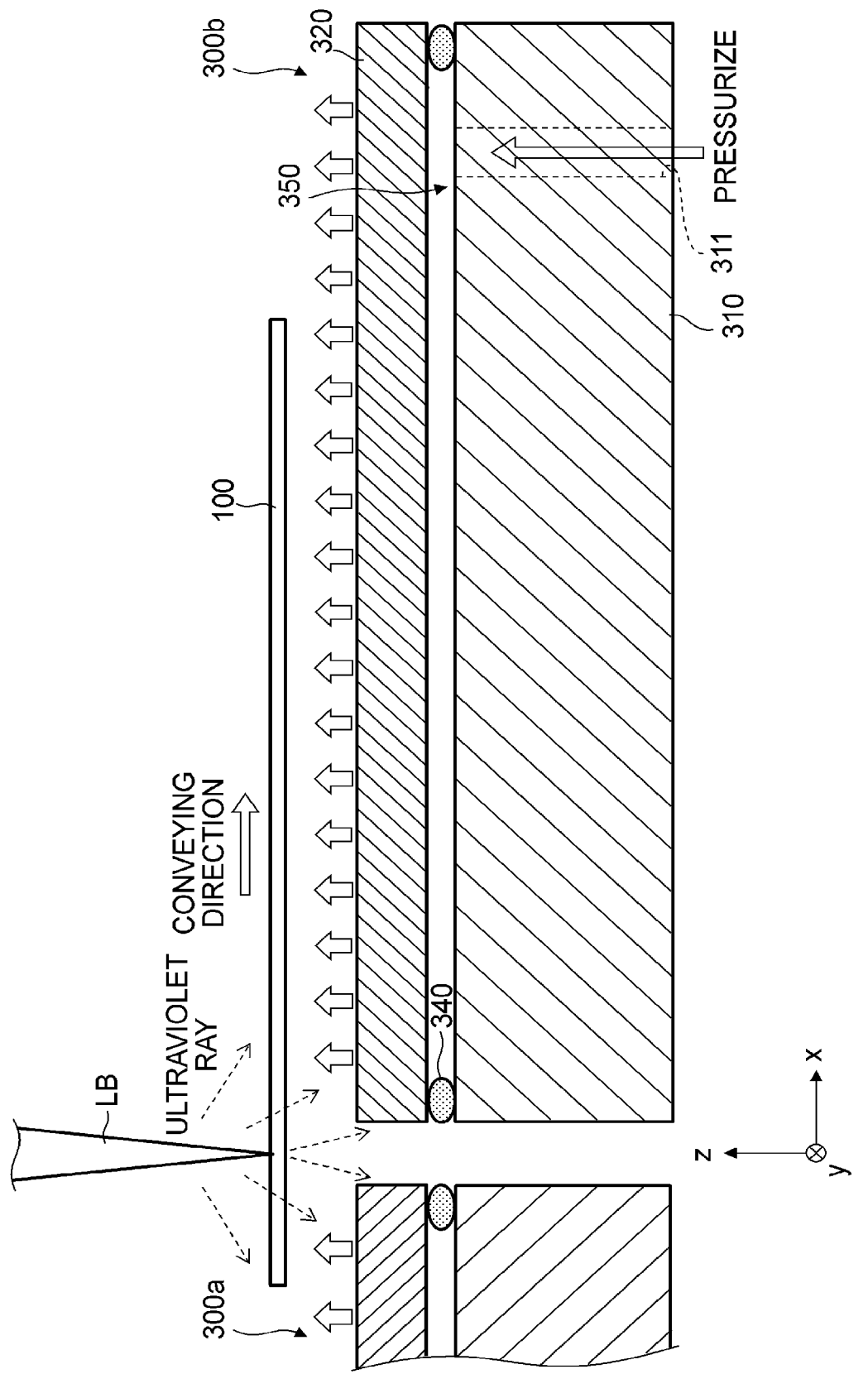
FIG. 3 is a cross-sectional view of the flotation unit according to comparative example 1 of the first embodiment, and is a view corresponding to a V-V cross-sectional view of FIG. 2.

Next, a flotation unit according to comparative example 1 of the first embodiment studied in advance by the inventors will be described with reference to FIG. 3. FIG. 3 is a cross-sectional view of the flotation unit according to comparative example 1 of the first embodiment, and is a view corresponding to a V-V cross-sectional view of FIG. 2. In addition, the right-handed system xyz coordinate illustrated in FIG. 3 matches with FIG. 1.

A flotation unit 300b according to comparative example 1 of the first embodiment includes a base 310 and a porous plate 320. In this regard, the base 310 and the porous plate 320 each have a simple plate shape. The porous plate 320 is applied to an upper surface of the base 310 of the plate shape by an adhesive layer 340 made from a resin adhesive. The adhesive layer 340 is formed in a square ring shape along an outer periphery of the base 310 in the plan view.

Hence, a pressurizing chamber 350 which is a space surrounded by the base 310, the porous plate 320 and the adhesive layer 340 is formed. A pressurizing through-hole 311 which penetrates an upper surface and a lower surface is formed in the base 310. The pressurized gas is introduced in the pressurizing chamber 350 via the pressurizing through-hole 311, and this gas passes the fine pores inside the porous plate 320 and is blown from the upper surface of the porous plate 320. Consequently, it is possible to float the plate-shaped workpiece 100.

As illustrated in FIG. 3, in the flotation unit 300b according to comparative example 1 of the first embodiment, the adhesive layer 340 is formed along the outer periphery of the base 310. Therefore, ultraviolet rays generated accompanying irradiation of the laser beam LB readily reach the adhesive layer 340 and deteriorate the adhesive layer 340. When the adhesive layer 340 deteriorates, airtightness of the pressurizing chamber 350 lowers, and the gas to be blown from the upper surface of the porous plate 320 decreases. Therefore, the plate-shaped workpiece 100 cannot be precisely floated. Furthermore, when the adhesive layer 340 deteriorates, a gas is generated by the resin adhesive, and negatively influences an irradiation result of the laser beam LB.

Flotation Unit According to Comparative Example 2 of First Embodiment

Figure 4:
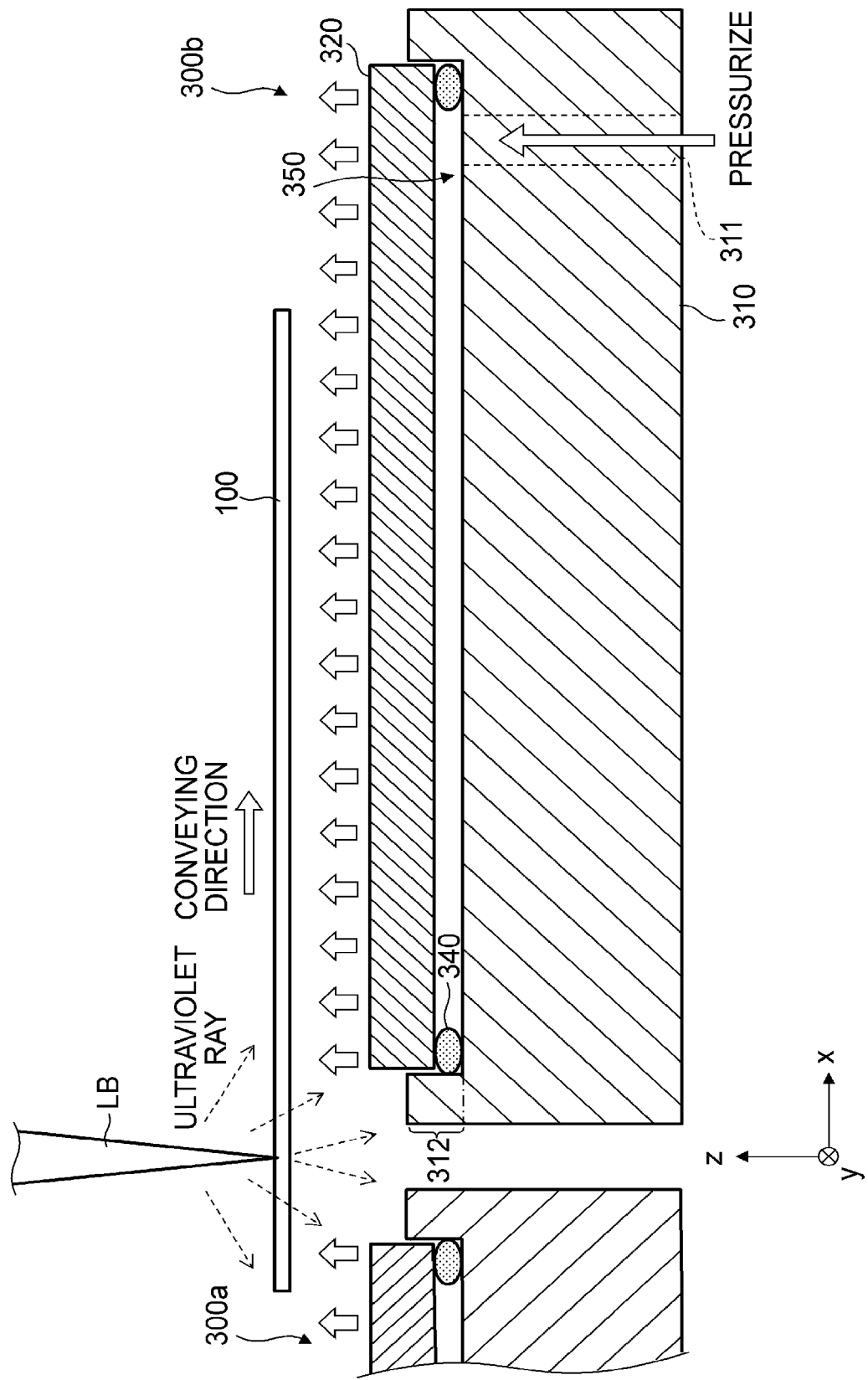
FIG. 4 is a cross-sectional view of the flotation unit according to comparative example 2 of the first embodiment, and is a view corresponding to the V-V cross-sectional view of FIG. 2.

Next, a flotation unit according to comparative example 2 of the first embodiment studied in advance by the inventors will be described with reference to FIG. 4. FIG. 4 is a cross-sectional view of the flotation unit according to comparative example 2 of the first embodiment, and is a view corresponding to the V-V cross-sectional view of FIG. 2. In addition, the right-handed system xyz coordinate illustrated in FIG. 4 matches with FIG. 1.

While the base 310 has the simple plate shape in comparative example 1 illustrated in FIG. 3, a rising portion 312 which protrudes upward is formed at the outer periphery of the base 310 in comparative example 2 illustrated in FIG. 4. The rising portion 312 is formed in a square ring along the outer periphery of the base 310 in the plan view.

Furthermore, while the porous plate 320 has the same size as the base 310 in comparative example 1 illustrated in FIG. 3, the porous plate 320 is a size smaller than the base 310 and is disposed on an inner side of the rising portion 312 in comparative example 2 illustrated in FIG. 4.

Furthermore, while the adhesive layer 340 is formed along the outer periphery of the base 310 in comparative example 1 illustrated in FIG. 3, the adhesive layer 340 is formed along an inner wall of the rising portion 312 in comparative example 2 in FIG. 4.

As illustrated in FIG. 4, in the flotation unit 300b according to comparative example 2 of the first embodiment, the adhesive layer 340 is formed on the inner side along the inner wall of the rising portion 312. Consequently, ultraviolet rays generated accompanying irradiation of the laser beam LB are blocked by the rising portion 312, so that it is possible to prevent deterioration of the adhesive layer 340 compared to the first comparative example. However, the ultraviolet rays having entered through the gap between the rising portion 312 of the base 310 and the porous plate 320 are concerned to reach the adhesive layer 340 and deteriorate the adhesive layer 340.

Flotation Unit According to First Embodiment

Figure 5:
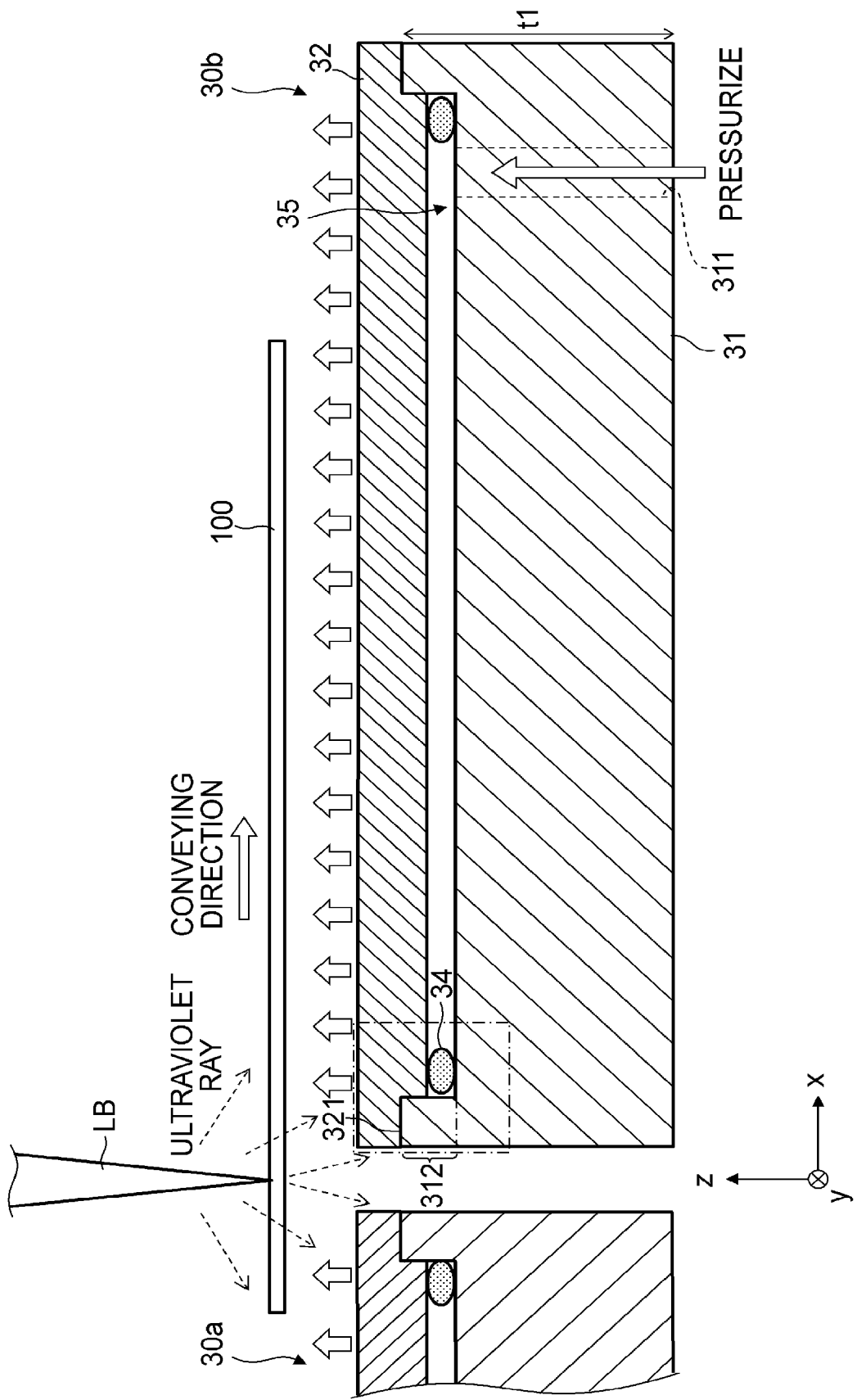
FIG. 5 is the V-V cross-sectional view of FIG. 2.
Figure 6:
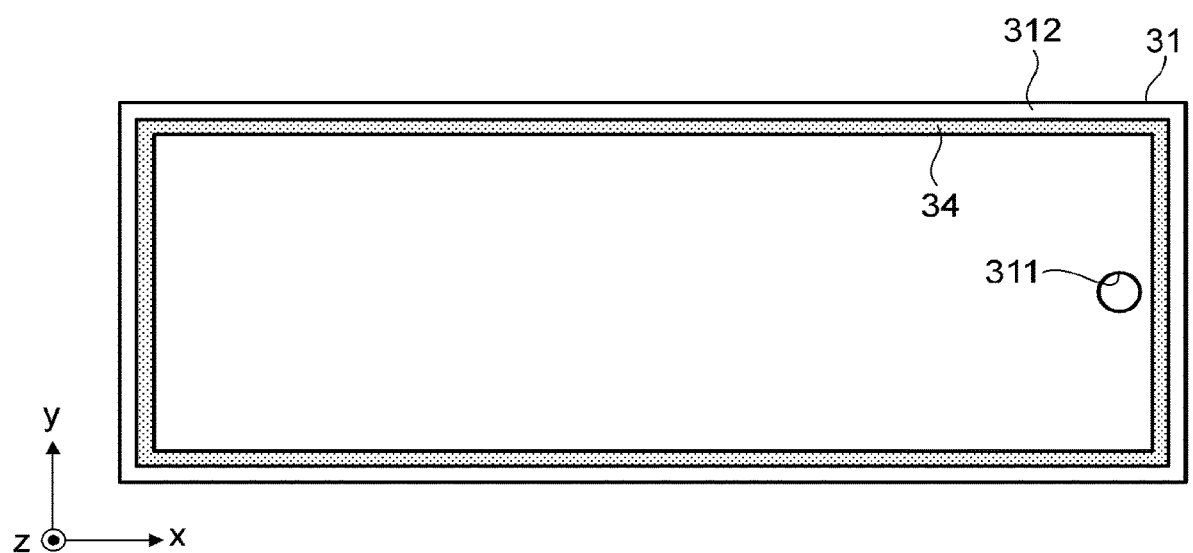
FIG. 6 is a plan view illustrating an adhesive layer 34 formed in the base 31.
Figure 7:
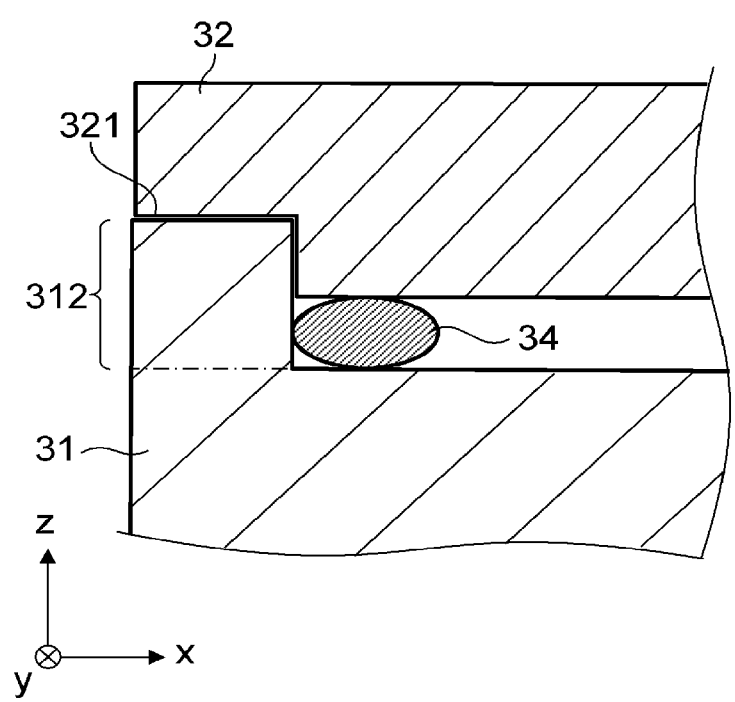
FIG. 7 is an enlarged view of a portion surrounded by a dashed-dotted line in FIG. 5.

Next, the flotation unit according to the first embodiment will be described in detail with reference to FIGS. 5 and 6. FIG. 5 is the V-V cross-sectional view of FIG. 2. FIG. 6 is a plan view illustrating an adhesive layer 34 formed in the base 31. FIG. 7 is an enlarged view of a portion surrounded by a dashed-dotted line in FIG. 5. In addition, the right-handed xyz coordinates illustrated in FIGS. 5 to 7 match with FIG. 1. The flotation units 30a and 30b are configured to form mirror symmetry with respect to a yz plane and are the same, and therefore a configuration of the flotation unit 30b will be described.

The flotation unit 30b according to the first embodiment includes the base 31 and the porous plate 32.

As illustrated in FIG. 5, the base 31 according to the first embodiment is a plate member in which the rising portion 312 protruding upward is formed at the outer periphery similar to the base 310 according to comparative example 2 illustrated in FIG. 4. As illustrated in FIG. 6, the rising portion 312 is formed in a square ring shape along the outer periphery of the base 31 in the plan view.

Furthermore, installation precision of the base 31 is required, and therefore a lower surface of the base 31 is polished. To precisely polish the lower surface of the base 31, a thickness t1 of the base 31 is preferably, for example, approximately 10 mm or more.

As illustrated in FIG. 5, the porous plate 32 according to the first embodiment has the same size as the base 31. Furthermore, as illustrated in FIG. 7, a cutout portion 321 which fits to the rising portion 312 of the base 31 is formed along the outer periphery. The cutout portion 321 is formed in a square ring shape along the outer periphery of the porous plate 32 in the plan view.

As illustrated in FIG. 5, the porous plate 32 is applied to the upper surface of the base 31 by the adhesive layer 34 made from a resin adhesive. In this regard, as illustrated in FIG. 7, the adhesive layer 34 is formed along the inner wall of the rising portion 312 of the base 31 which has fitted to the cutout portion 321 of the porous plate 32.

As illustrated in FIG. 6, the adhesive layer 34 is formed in a square ring shape along the inner wall of the rising portion 312 of the base 31 in the plan view. In this case, the adhesive layer 34 does not need to closely adhere to the inner wall of the rising portion 312. For the resin adhesive which forms the adhesive layer 34, an epoxy adhesive can be used, for example.

As illustrated in FIG. 5, a pressurizing chamber 35 which is a space surrounded by the base 31, the porous plate 32 and the adhesive layer 34 is formed. The pressurizing through-hole 311 which penetrates the upper surface and the lower surface is formed at an end portion on the x axis direction plus side of the base 31. The pressurized gas is introduced in the pressurizing chamber 35 via the pressurizing through-hole 311, and this gas passes the fine pores inside the porous plate 32 and is blown from the upper surface of the porous plate 32. Consequently, it is possible to float the plate-shaped workpiece 100. In addition, although not illustrated, the pressurizing through-hole 311 is connected with a pressurizing apparatus such as a compressor or a blower via a pipe.

As described above, in the flotation unit 30b according to the first embodiment, the rising portion 312 protruding upward is formed at the outer periphery of the base 31. Furthermore, the cutout portion 321 which fits to the rising portion 312 of the base 31 is formed at the outer periphery of the porous plate 32. Furthermore, the adhesive layer 34 is formed along the inner wall of the rising portion 312 which has fitted to the cutout portion 321.

Generally, the cutout portion 321 of the porous plate 32 and the rising portion 312 of the base 31 are closely adhered, and therefore ultraviolet rays generated accompanying irradiation of the laser beam LB do not reach the adhesive layer 34. If a gap is formed between the cutout portion 321 and the rising portion 312, and ultraviolet rays enter through the gap, the ultraviolet rays hardly reach the adhesive layer 34 formed on the inner side of the rising portion 312 which has fitted to the cutout portion 321. Consequently, according to this configuration, it is possible to effectively prevent deterioration of the adhesive layer 34.

Flotation Unit According to Modified Example of First Embodiment

Figure 8:
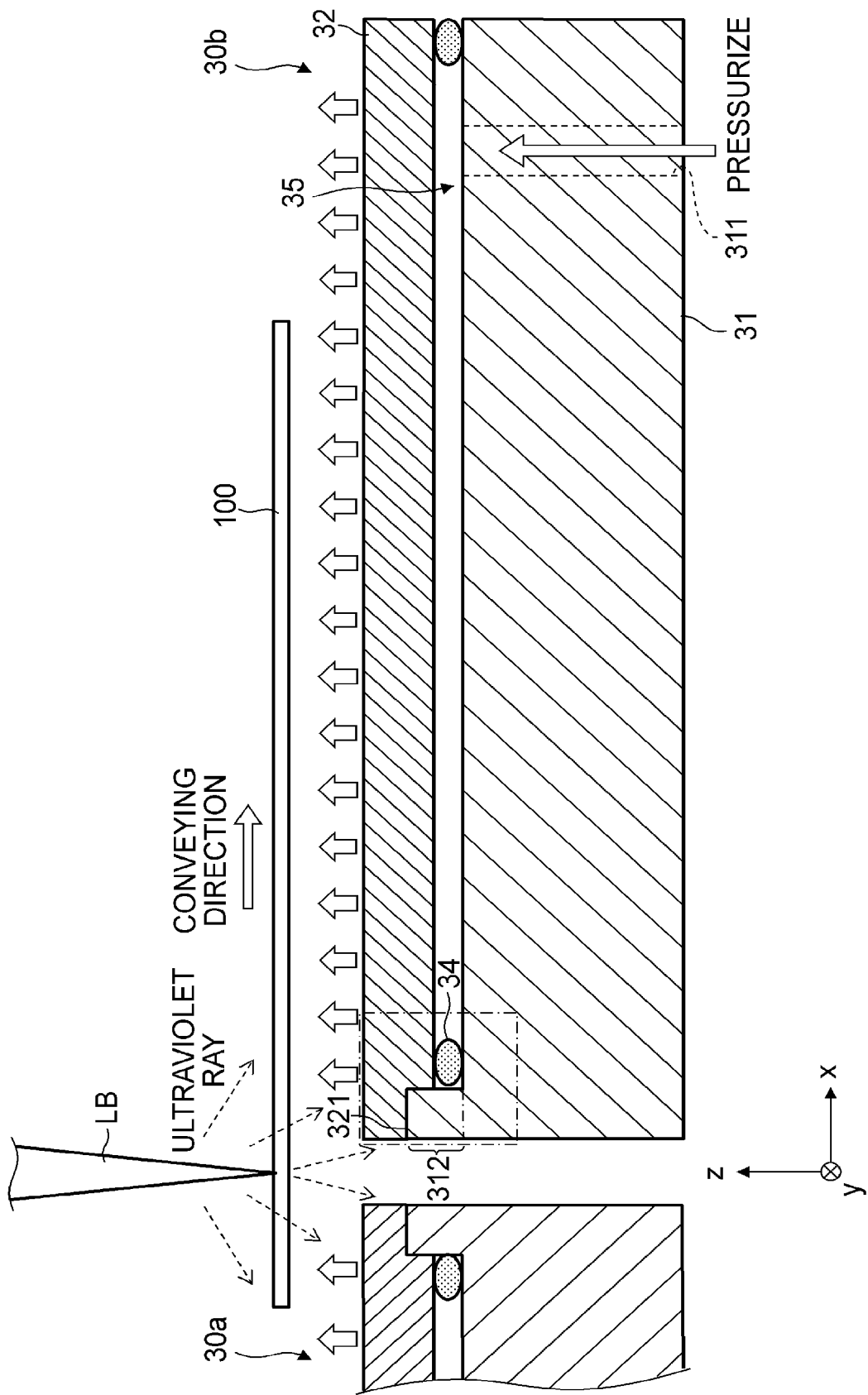
FIG. 8 is a cross-sectional view of the flotation unit according to the modified example of the first embodiment.
Figure 9:
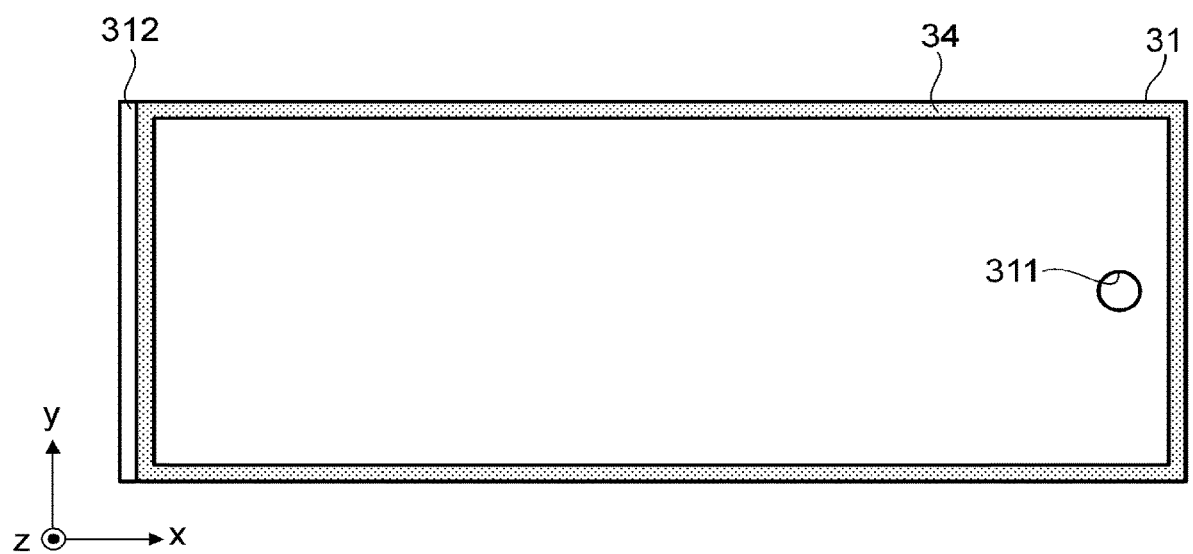
FIG. 9 is a plan view illustrating the adhesive layer 34 formed in the base 31.

Next, details of the flotation unit according to a modified example of the first embodiment will be described with reference to FIGS. 8 and 9. FIG. 8 is a cross-sectional view of the flotation unit according to the modified example of the first embodiment. FIG. 8 corresponds to FIG. 5. FIG. 9 is a plan view illustrating the adhesive layer 34 formed in the base 31.

As illustrated in FIG. 6, in the base 31 of the flotation unit 30b according to the first embodiment, the rising portion 312 is formed at the entire outer periphery. By contrast with this, as illustrated in FIGS. 8 and 9, in the base 31 of the flotation unit 30b according to the modified example of the first embodiment, the rising portion 312 is formed only at the outer periphery facing the gap to be irradiated with the laser beam LB. The rising portion 312 is not formed at the other outer periphery. That is, as illustrated in FIG. 9, the rising portion 312 is linearly formed in the y axis direction along an outer periphery on an x axis direction minus side.

Furthermore, as illustrated in FIG. 8, in the porous plate 32 of the flotation unit 30b according to the modified example of the first embodiment, the cutout portion 321 which fits to the rising portion 312 is formed only at the outer periphery facing the gap to be irradiated with the laser beam LB. The cutout portion 321 is not formed at the other outer periphery. That is, the cutout portion 321 is linearly formed in the y axis direction along the outer periphery on the x direction minus side.

As illustrated in FIG. 8, the porous plate 32 is applied to the upper surface of the base 31 by the adhesive layer 34 made from the resin adhesive. In this regard, as illustrated in FIGS. 8 and 9, the adhesive layer 34 is formed on the inner side along the inner wall of the rising portion 312 of the base 31 which has fitted to the cutout portion 321 of the porous plate 32. On the other hand, as illustrated in FIG. 9, the rising portion 312 is not formed at the outer periphery which does not face the gap to be irradiated with the laser beam LB, and the adhesive layer 34 is formed at the outer periphery. Hence, the adhesive layer 34 is formed in the square ring shape in the plan view.

As described above, in the flotation unit 30b according to the first embodiment, the rising portion 312 protruding upward is formed at the outer periphery of the base 31 facing the gap to be irradiated with the laser beam LB. Furthermore, the cutout portion 321 which fits to the rising portion 312 is formed at the outer periphery of the porous plate 32 facing the gap to be irradiated with the laser beam LB. Furthermore, the adhesive layer 34 is formed on the inner side along the inner wall of the rising portion 312 which has fitted to the cutout portion 321.

Generally, the cutout portion 321 of the porous plate 32 and the rising portion 312 of the base 31 are closely adhered, and therefore the ultraviolet rays generated accompanying irradiation of the laser beam LB do not reach the adhesive layer 34. If the gap is formed between the cutout portion 321 and the rising portion 312, and the ultraviolet rays enter through the gap, the ultraviolet rays hardly reach the adhesive layer 34 formed on the inner side of the rising portion 312 which has fitted to the cutout portion 321. Consequently, it is possible to effectively prevent deterioration of the adhesive layer 34.

In addition, in the flotation unit 30b according to the modified example of the first embodiment, the rising portion 312 is not formed at the outer periphery which does not face the gap to be irradiated with the laser beam LB, and the adhesive layer 34 is formed at this outer periphery. However, the adhesive layer 34 does not face the gap to be irradiated with the laser beam LB, and therefore even when the adhesive layer 34 is formed at the outer periphery, the ultraviolet rays hardly reach the adhesive layer 34.

Second Embodiment

Next, a laser irradiation apparatus according to the second embodiment will be described. An entire configuration of the laser irradiation apparatus according to the second embodiment is the same as an entire configuration of a laser irradiation apparatus according to the first embodiment illustrated in FIGS. 1 and 2, and therefore will not be described. The laser irradiation apparatus according to the second embodiment differs from the laser irradiation apparatus according to the first embodiment in a configuration of a flotation unit.

Flotation Unit According to Comparative Example of Second Embodiment

Figure 10:
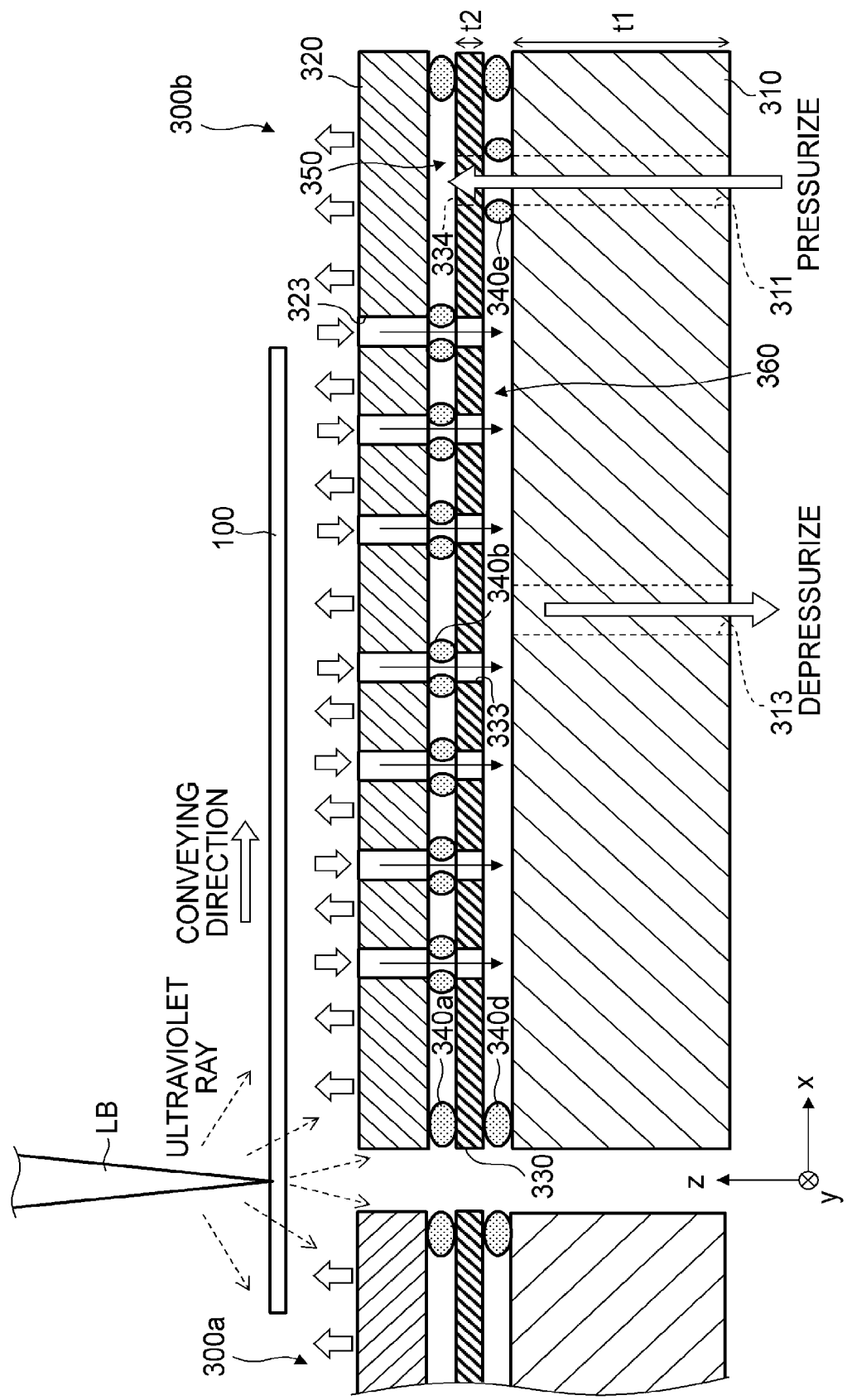
FIG. 10 is a cross-sectional view of the flotation unit according to the comparative example of the second embodiment, and is a view corresponding to the V-V cross-sectional view of FIG. 2.

First, the flotation unit according to a comparative example of the second embodiment studied in advance by the inventors will be described with reference to FIG. 10. FIG. 10 is a cross-sectional view of the flotation unit according to the comparative example of the second embodiment, and is a view corresponding to the V-V cross-sectional view of FIG. 2. In addition, the right-handed xyz coordinate illustrated in FIG. 10 matches with FIG. 1.

As illustrated in FIG. 10, a flotation unit 300b according to the comparative example of the second embodiment includes a base 310 and a porous plate 320 according to comparative example 1 of the first embodiment illustrated in FIG. 3, and, in addition, an intermediate plate 330 between the base 310 and the porous plate 320. In this regard, the intermediate plate 330 has a simple plate shape similar to the base 310 and the porous plate 320. The intermediate plate 330 is a plate member made of a metal such as aluminum or stainless steel similar to the base 310, and has the same size as the base 310. A thickness t2 of the intermediate plate 330 is thinner than a thickness t1 of the base 310.

The porous plate 320 is applied to an upper surface of the intermediate plate 330 of the plate shape by an adhesive layer 340a. The adhesive layer 340a is formed in a square ring shape along an outer periphery of the upper surface of the intermediate plate 330 in the plan view.

The intermediate plate 330 is applied to an upper surface of the base 310 by an adhesive layer 340d. The adhesive layer 340d is formed in a square ring shape along the outer periphery of the upper surface of the base 310 in the plan view.

As illustrated in FIG. 10, a pressurizing chamber 350 which is a space surrounded by the porous plate 320, the intermediate plate 330 and the adhesive layer 340a is formed. A pressurizing through-hole 311 which penetrates the upper surface and a lower surface is formed at an end portion on an x axis direction plus side of the base 310. A through-hole 334 is formed in the intermediate plate 330. Furthermore, the pressurizing through-hole 311 of the base 310 and the pressurizing through-hole 334 of the intermediate plate 330 are formed at positions which meet each other, and are connected by an adhesive layer 340e of a ring shape. Furthermore, the adhesive layer 340a partitions the pressurizing chamber 350 and a depressurizing chamber 360, and keeps airtightness of the pressurizing chamber 350 and the depressurizing chamber 360.

A pressurized gas is introduced in the pressurizing chamber 350 via the pressurizing through-hole 311 of the base 310, the adhesive layer 340e and the pressurizing through-hole 334 of the intermediate plate 330, and this gas passes fine pores inside the porous plate 320 and is blown from the upper surface of the porous plate 320. Consequently, it is possible to float a plate-shaped workpiece 100.

On the other hand, as illustrated in FIG. 10, the depressurizing chamber 360 which is a space surrounded by the base 310, the intermediate plate 330 and the adhesive layer 340d is formed. A depressurizing through-hole 313 which penetrates the upper surface and the lower surface is formed at a center portion of the base 310. The gas in the depressurizing chamber 360 is exhausted via the depressurizing through-hole 313.

In addition, multiple through-holes 333 are formed over a substantially entire surface of the intermediate plate 330 which forms the depressurizing chamber 360. Furthermore, multiple through-holes 323 are formed over a substantially entire surface of the porous plate 320, too. Furthermore, the through-holes 323 of the porous plate 320 and the through-holes 333 of the intermediate plate 330 are formed at positions which meet each other, and are connected by adhesive layers 340b of ring shapes. Consequently, the gas on the porous plate 320 is suctioned through the through-holes 323 of the porous plate 320, the adhesive layers 340b and the through-holes 333 of the intermediate plate 330. Consequently, it is possible to suction the plate-shaped workpiece 100. Furthermore, the adhesive layers 340b partition the pressurizing chamber 350 and the depressurizing chamber 360, and keep airtightness of the pressurizing chamber 350 and the depressurizing chamber 360.

That is, the flotation unit 300b according to the comparative example of the second embodiment blows the gas through the pores of the porous plate 320 to float the plate-shaped workpiece 100, and suctions the gas through the through-holes 323 of the porous plate 320 to suction the plate-shaped workpiece 100. Thus, by keeping a balance between levitation by gas pressurization and suctioning by gas depressurization, the flotation unit 300b according to comparative example 1 of the first embodiment illustrated in FIG. 3 can precisely float the plate-shaped workpiece 100. More specifically, it is possible to more precisely float the plate-shaped workpiece 100 at a focal position of a laser beam LB.

As illustrated in FIG. 10, in the flotation unit 300b according to the comparative example of the second embodiment, the adhesive layer 340a is formed along the outer periphery of the upper surface of the intermediate plate 330, and the adhesive layer 340d is formed along the outer periphery of the upper surface of the base 310. Hence, ultraviolet rays generated accompanying irradiation of the laser beam LB readily reach the adhesive layers 340a and 340d, and deteriorate the adhesive layers 340a and 340d.

When the adhesive layer 340a deteriorates, the airtightness of the pressurizing chamber 350 lowers, and the gas to be blown from the upper surface of the porous plate 320 decreases. On the other hand, when the adhesive layer 340d deteriorates, the airtightness of the depressurizing chamber 360 lowers, and the gas to be suctioned through the through-holes 323 of the porous plate 320 decreases. Therefore, it is not possible to precisely float the plate-shaped workpiece 100.

Flotation Unit According to Second Embodiment

Figure 11:
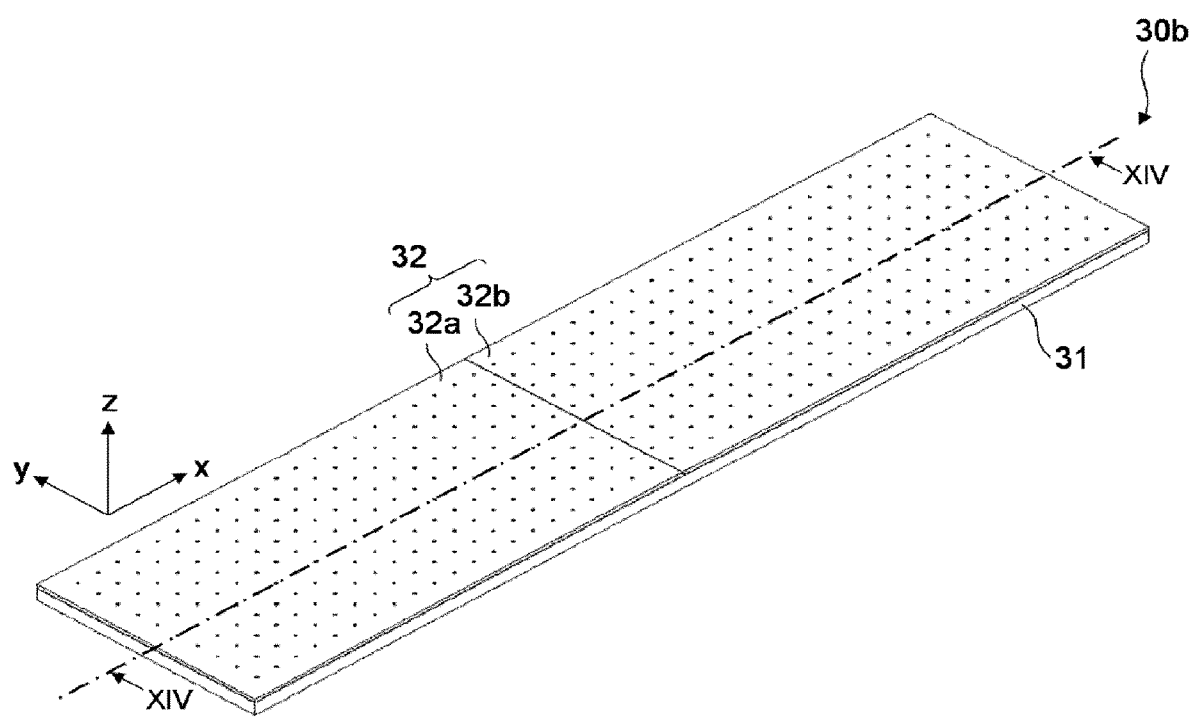
FIG. 11 is a perspective view of the flotation unit according to the second embodiment.
Figure 12:
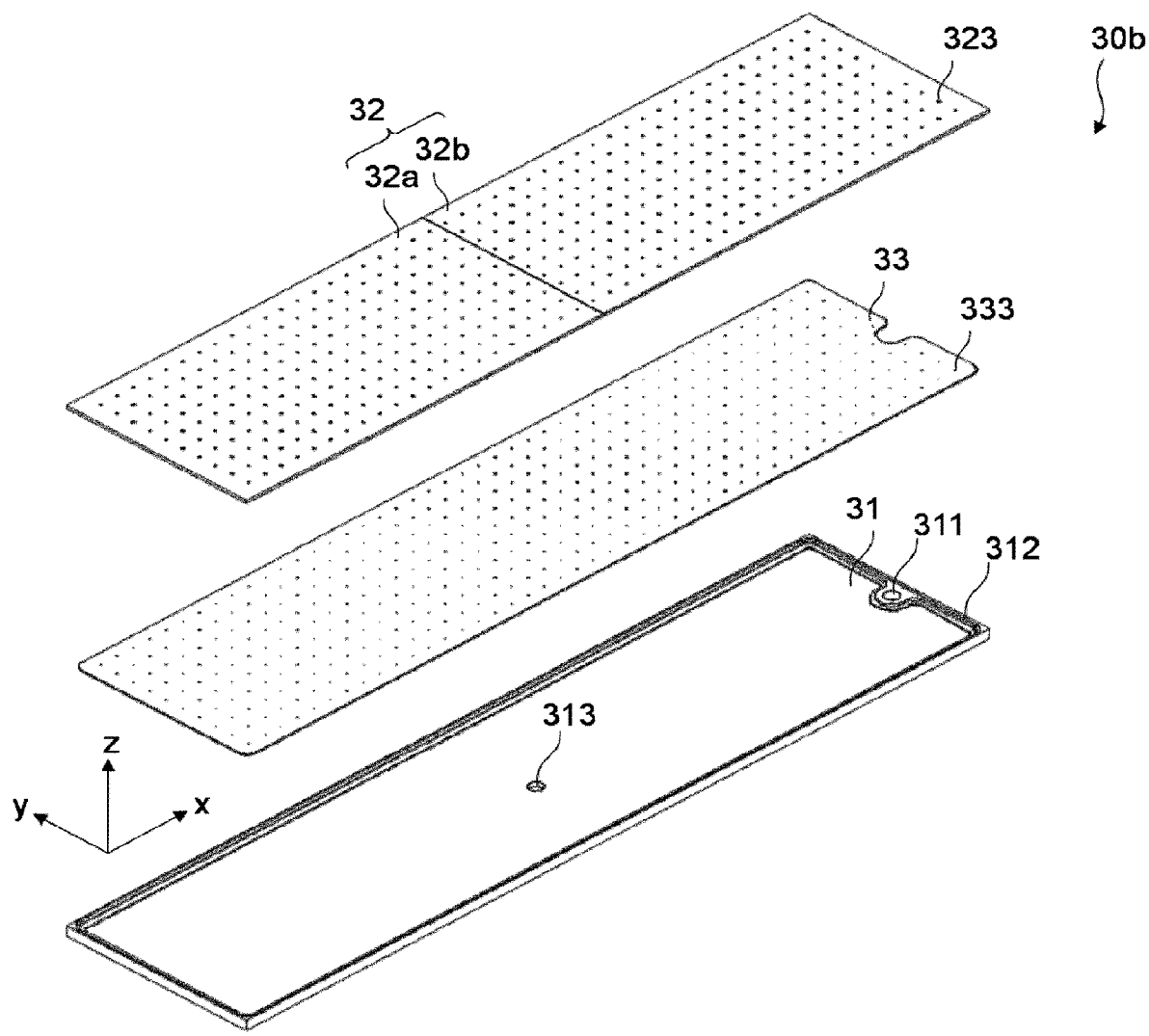
FIG. 12 is exploded perspective views of the flotation unit according to the second embodiment.
Figure 13:
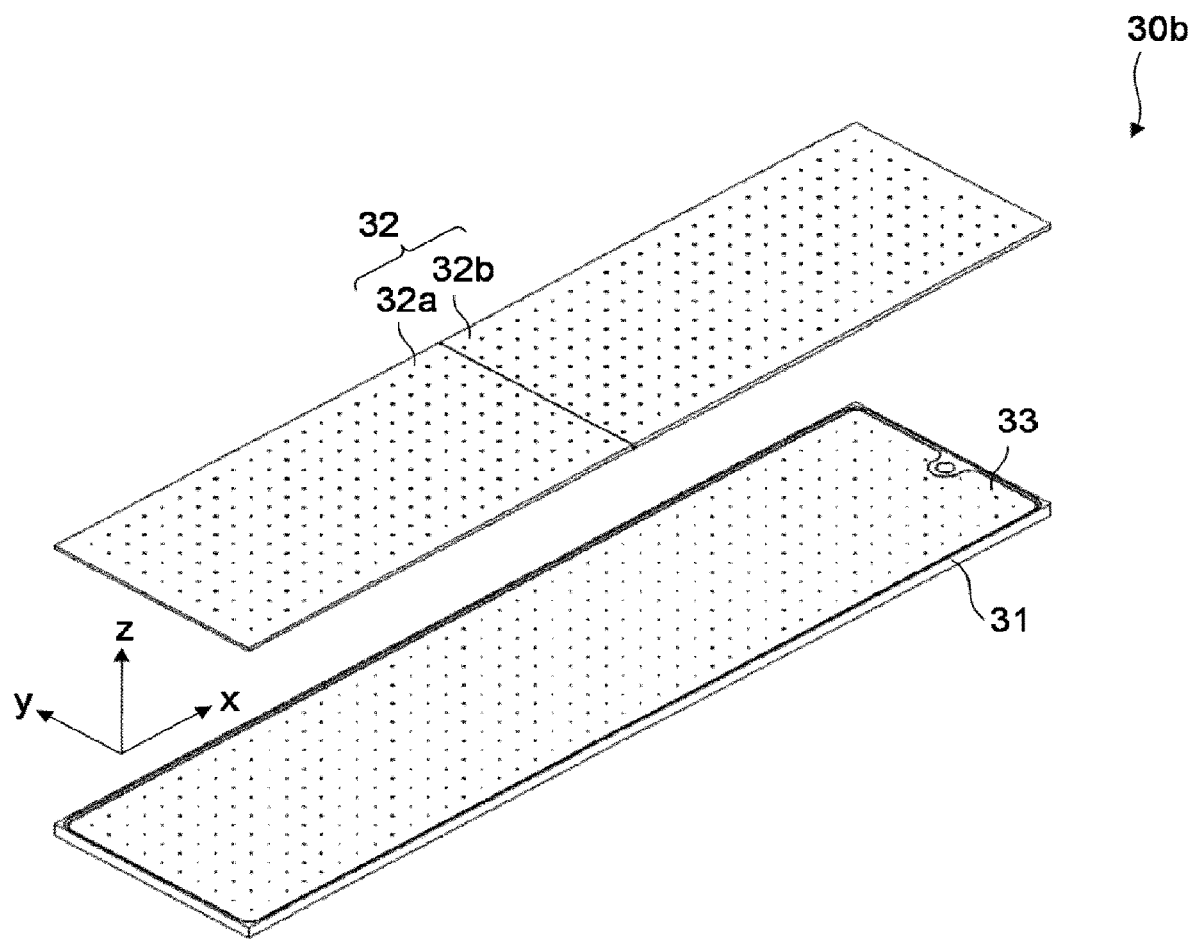
FIG. 13 is exploded perspective views of the flotation unit according to the second embodiment.
Figure 14:
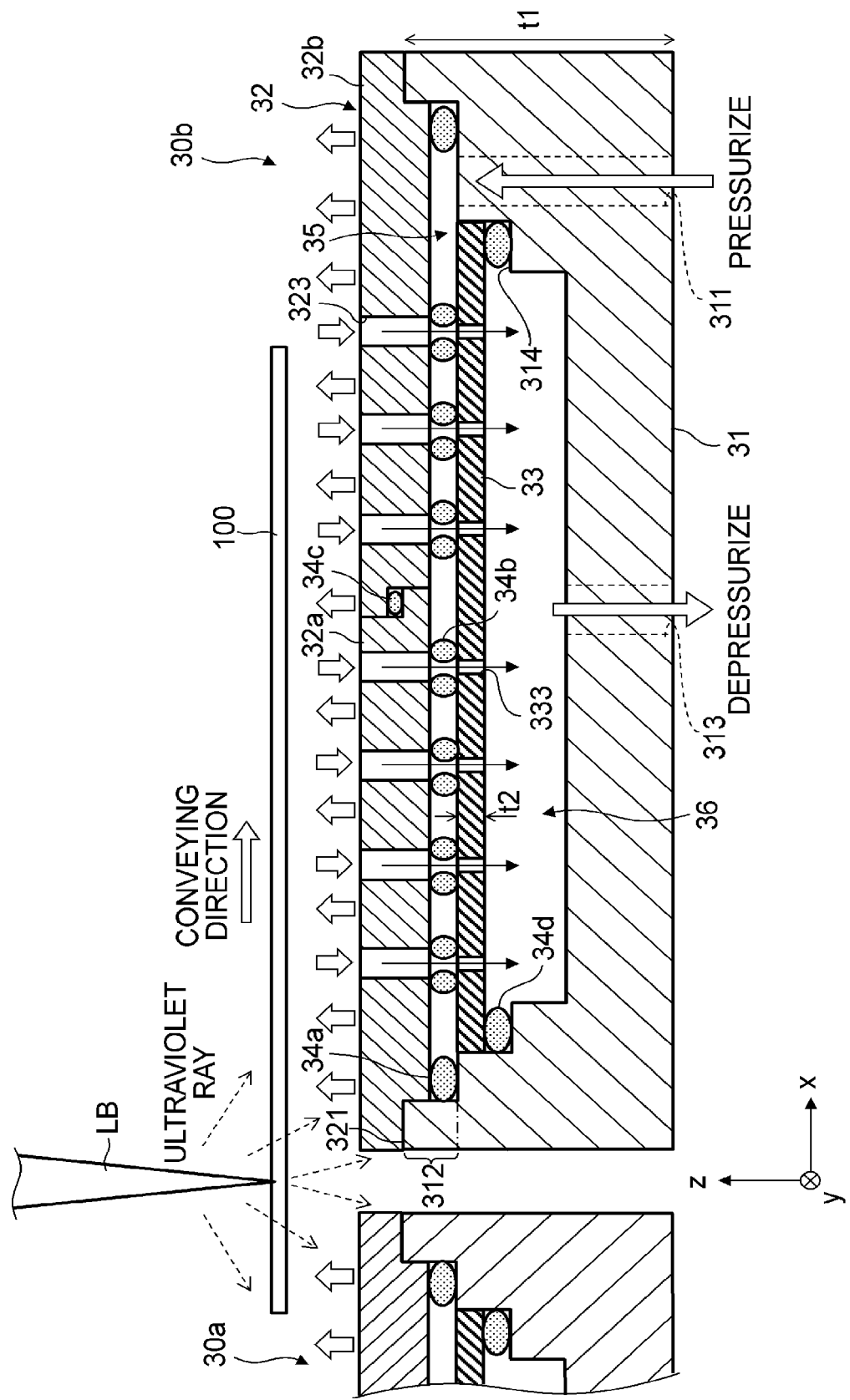
FIG. 14 is a XIV-XIV cross-sectional view of FIG. 11. p
Figure 15:
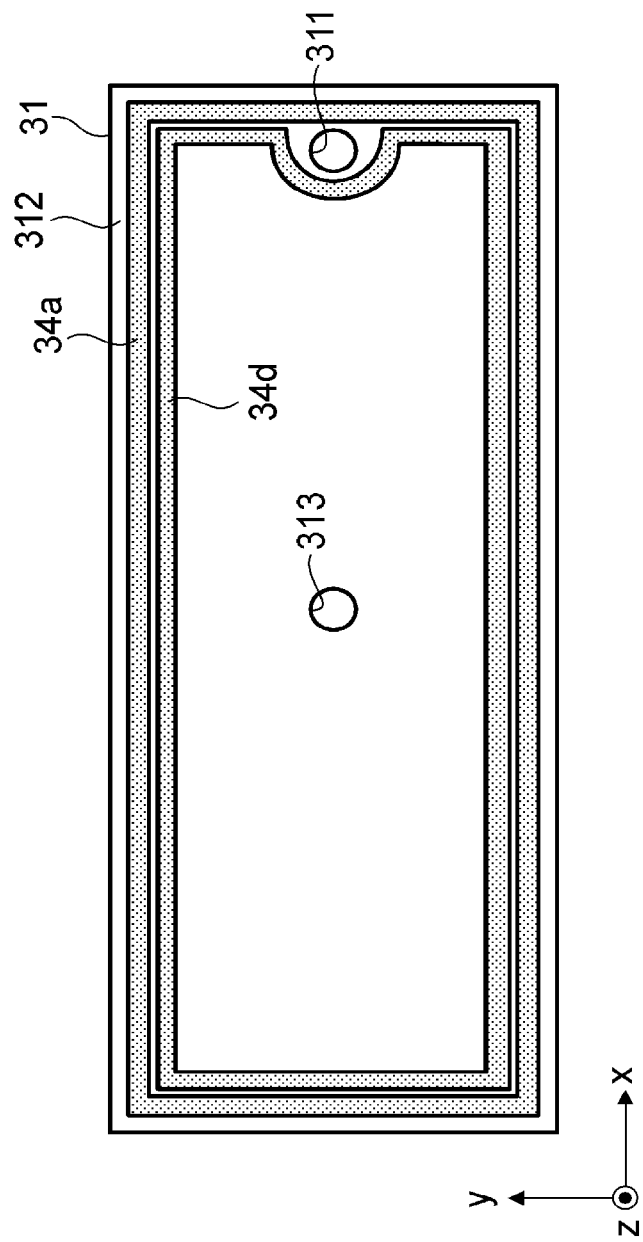
FIG. 15 is a plan view illustrating adhesive layers 34*a* and 34*d* formed in a base 31.

Next, a flotation unit according to the second embodiment will be described with reference to FIGS. 11 to 15. FIG. 11 is a perspective view of the flotation unit according to the second embodiment. FIGS. 12 and 13 are exploded perspective views of the flotation unit according to the second embodiment. FIG. 14 is a XIV-XIV cross-sectional view of FIG. 11. FIG. 14 corresponds to a V-V cross-sectional view of FIG. 2. FIG. 15 is a plan view illustrating adhesive layers 34a and 34d formed in a base 31.

In addition, right-handed systems xyz coordinates illustrated in FIGS. 11 to 15 match with FIG. 1.

As illustrated in FIG. 11, a flotation unit 30b according to the second embodiment also employs a configuration where a porous plate 32 is seemingly bonded to the base 31 similar to the flotation unit 30b according to the first embodiment. In this regard, the porous plate 32 of the flotation unit 30b according to the second embodiment is divided into two at a center portion in a longitudinal direction (x axis direction). That is, two short porous plates 32a and 32b are bonded at the center portion in the longitudinal direction to form the long porous plate 32. In a case of a ceramic, a porous plate formed by bonding two short porous plates can be more easily and cheaply manufactured than one long porous plate.

On the other hand, as illustrated in FIG. 12, the flotation unit 30b according to the second embodiment includes the base 31 and the porous plate 32 and, in addition, an intermediate plate 33. Similar to the base 31, the intermediate plate 33 is a plate member made of a metal such as aluminum or stainless steel. As illustrated in FIG. 13, the intermediate plate 33 is a size smaller than the base 31 and is accommodated in the base 31.

As illustrated in FIG. 12, the multiple through-holes (first through-holes) 323 are disposed in the longitudinal direction (x axis direction) and a width direction (y axis direction) at equal intervals on a substantially entire surface of the porous plate 32 according to the second embodiment.

The multiple through-holes (second through-holes) 333 are disposed in the longitudinal direction (x axis direction) and the width direction (y axis direction) at equal intervals on a substantially entire surface of the intermediate plate 33, too. The through-holes 323 of the porous plate 32 and the through-holes 333 of the intermediate plate 33 are formed at positions which meet each other.

The pressurizing through-hole 311 and, in addition, the depressurizing through-hole 313 are formed in the base 31. The pressurizing through-hole 311 is formed at a center of an end portion on the x axis direction plus side. The depressurizing through-hole 313 is formed at the center portion.

Next, a configuration of the flotation unit 30b according to the second embodiment will be further described with reference to FIGS. 14 and 15.

As illustrated in FIG. 14, the base 31 according to the second embodiment is a plate member on which a rising portion 312 protruding upward is formed at an outer periphery similar to the base 31 according to the first embodiment illustrated in FIG. 5. As illustrated in FIG. 15, the rising portion 312 is formed in a square ring shape along the outer periphery of the base 31 in the plan view.

Furthermore, installation precision of the base 31 is required, and therefore a lower surface of the base 31 is polished. To precisely polish the lower surface of the base 31, the thickness t1 of the base 31 is preferably, for example, approximately 10 mm or more.

Figure 16:
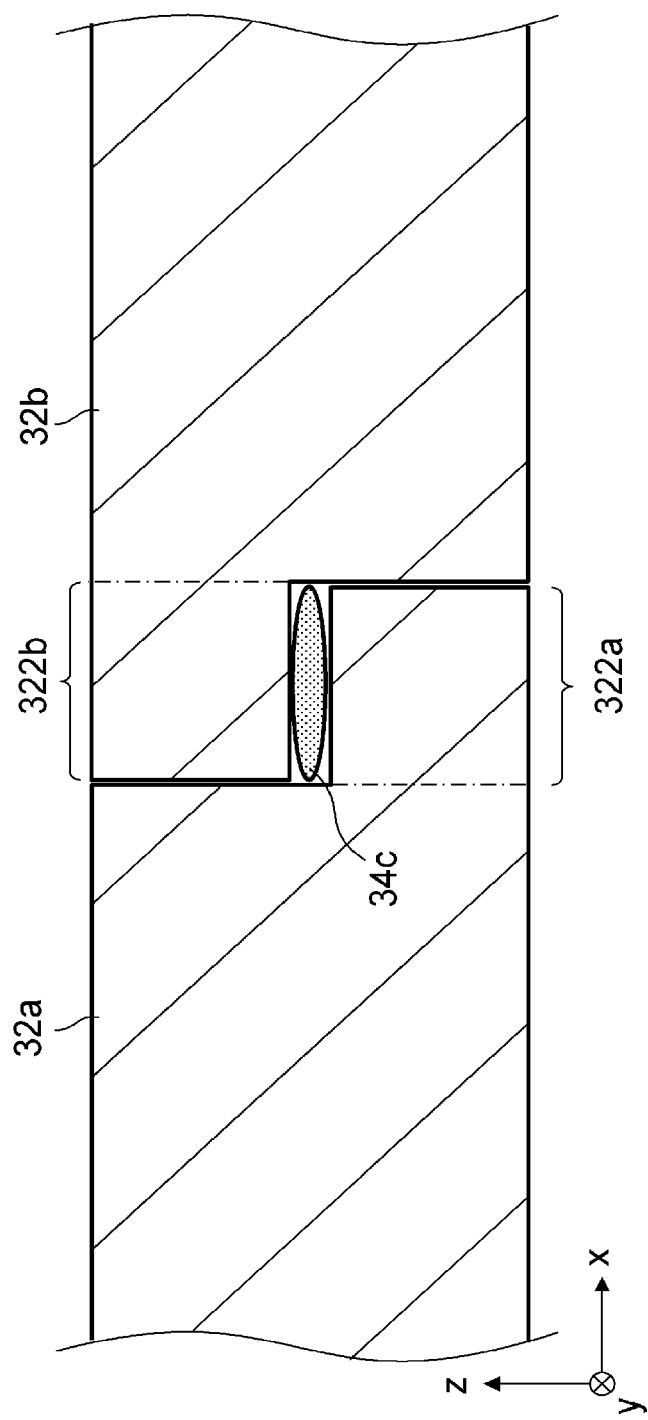
FIG. 16 is an enlarged view of a bonding portion of the short porous plates 32*a* and 32*b*.

As illustrated in FIG. 14, in the porous plate 32 according to the second embodiment, the two short porous plates 32a and 32b are bonded by the adhesive layer 34c at a center portion in the longitudinal direction. The adhesive layer 34c keeps airtightness of a pressurizing chamber 35. In this regard, FIG. 16 is an enlarged view of a bonding portion of the short porous plates 32a and 32b. As illustrated in FIG. 16, a protrusion portion 322a is formed on a lower side of a butting end surface of the short porous plate (first plate) 32a with respect to the short porous plate (second plate) 32b. Furthermore, a protrusion portion 322b is formed on an upper side of a butting end surface of the short porous plate 32b with respect to the short porous plate 32a. Furthermore, the adhesive layer 34c is formed between the protrusion portion 322a of the short porous plate 32a and the protrusion portion 322b of the short porous plate 32b.

As illustrated in FIG. 14, the bonding portion of the short porous plates 32a and 32b is apart from an irradiation position of the laser beam LB, and therefore the ultraviolet rays generated accompanying irradiation of the laser beam LB hardly reach the bonding portion. Furthermore, even if the ultraviolet rays reach the bonding portion, the ultraviolet rays are blocked by the protrusion portion 322b of the short porous plate 32b as illustrated in FIG. 16, so that it is possible to effectively prevent deterioration of the adhesive layer 34c.

As illustrated in FIG. 14, the porous plate 32 has the same size as the base 31. Furthermore, a cutout portion 321 which fits to the rising portion 312 of the base 31 is formed along the outer periphery. The cutout portion 321 is formed in a square ring shape along the outer periphery of the porous plate 32 in the plan view. The porous plate 32 is applied to the upper surface of the base 31 by the adhesive layer 34a made from a resin adhesive. In this regard, the adhesive layer 34a is formed along an inner wall of the rising portion 312 of the base 31 which has fitted to the cutout portion 321 of the porous plate 32. As illustrated in FIG. 15, the adhesive layer 34a is formed in a square ring shape along the inner wall of the rising portion 312 of the base 31 in the plan view.

Furthermore, as illustrated in FIG. 14, a region surrounded by the adhesive layer 34a is dug downward in the base 31 according to the second embodiment to form a cavity which forms the depressurizing chamber 36. A counterbored groove 314 is formed at a periphery of this cavity. The intermediate plate 33 is fitted to this counterbored groove 314, and the adhesive layer 34d formed on the counterbored groove 314 adheres the intermediate plate 33 to the base 31. In this regard, the upper surface of the intermediate plate 33 matches with the upper surface of the base 31 in which the adhesive layer 34a is formed. That is, the intermediate plate 33 is accommodated inside the base 31 below the porous plate 32 and in parallel to the porous plate 32. Naturally, the thickness t2 of the intermediate plate 33 is thinner than the thickness t1 of the base 31.

As illustrated in FIG. 15, the adhesive layer 34d is formed in a square ring shape along the inner side of the adhesive layer 34a in the plan view. In this regard, the pressurizing through-hole 311 is located on the inner side of the adhesive layer 34a and the outer side of the adhesive layer 34d.

In addition, a plurality of projections having the same height as a bottom surface of the counterbored groove 314 may be provided to the depressurizing chamber 36, and the adhesive layer 34d may be formed on upper surfaces of the projections to make an adhesion area of the base 31 and the intermediate plate 33 larger.

As illustrated in FIG. 14, the pressurizing chamber 35 which is a space surrounded by the base 31, the porous plate 32, the intermediate plate 33 and the adhesive layer 34a is formed on an upper side of the intermediate plate 33. The pressurizing through-hole 311 which penetrates the upper surface and the lower surface is formed at an end portion on the x axis direction plus side of the base 31. The pressurized gas is introduced in the pressurizing chamber 35 via the pressurizing through-hole 311, and this gas passes fine pores inside the porous plate 32 and is blown from the upper surface of the porous plate 32. Consequently, it is possible to float the plate-shaped workpiece 100. In addition, although not illustrated, a pressurizing apparatus such as a compressor or a blower is connected to the pressurizing through-hole 311 via a pipe.

On the other hand, as illustrated in FIG. 14, the depressurizing chamber 36 which is a space surrounded by the base 31, the intermediate plate 33 and the adhesive layer 34d is formed on a lower side of the intermediate plate 33. Thus, the intermediate plate 33 partitions the pressurizing chamber 35 and the depressurizing chamber 36. The depressurizing through-hole 313 which penetrates the upper surface and the lower surface is formed at a center portion of the base 31. The gas of the depressurizing chamber 36 is exhausted via the depressurizing through-hole 313. In addition, although not illustrated, a depressurizing apparatus such as a vacuum pump or an ejector is connected to the depressurizing through-hole 313 via a pipe.

In this regard, the multiple through-holes 333 are formed on a substantially entire surface of the intermediate plate 33 which forms the depressurizing chamber 36. Furthermore, the multiple through-holes 323 are formed over a substantially entire surface of the porous plate 32, too. Furthermore, the through-holes 323 of the porous plate 32 and the through-holes 333 of the intermediate plate 33 are formed at positions which meet each other, and are connected by adhesive layers 34b of ring shapes. Hence, the gas on the porous plate 32 is suctioned to the depressurizing chamber 36 via the through-holes 323 of the porous plate 32, the adhesive layers 34b and the through-holes 333 of the intermediate plate 33. Consequently, it is possible to suction the plate-shaped workpiece 100.

That is, the flotation unit 30b according to the second embodiment blows the gas through the pores of the porous plate 32 to float the plate-shaped workpiece 100, and suction the gas through the through-holes 323 of the porous plate 32 to suction the plate-shaped workpiece 100. Thus, by keeping a balance between levitation by gas pressurization and suctioning by gas depressurization, it is possible to more precisely float the plate-shaped workpiece 100 than the flotation unit 30b according to the first embodiment. More specifically, it is possible to more precisely float the plate-shaped workpiece 100 at a focal position of the laser beam LB. For example, it is possible to precisely float the plate-shaped workpiece 100 at approximately 20 to 50 μm.

In this regard, to precisely float the plate-shaped workpiece 100, it is preferable to uniformly blow a gas from pores on the entire surface of the porous plate 32 and suction the gas through the through-holes 323.

Pore diameters of the porous plate 32 are, for example, approximately several lam and very fine, and therefore resistances of gas routes are high, so that it is possible to make a pressure distribution in the pressurizing chamber 35 uniform. As a result, it is possible to uniformly blow the gas on the entire surface of the porous plate 32.

On the other hand, to uniformly suction the gas on the entire surface of the porous plate 32, it is necessary to reduce the diameters of suction routes (the through-holes 323 of the porous plate 32 and the through-holes 333 of the intermediate plate 33) and increase resistances of the gas routes. Consequently, it is possible to make the pressure distribution in the depressurizing chamber 36 uniform, and uniformly suction the gas on the entire surface of the porous plate 32.

The flotation unit 30b according to the second embodiment can make the pressure distribution in the depressurizing chamber 36 uniform by reducing the diameters of the suction routes, so that one (singular) pipe can connect the depressurizing through-holes 313 and the depressurizing chamber 36. Consequently, compared to a case where a plurality of depressurizing through-holes 313 are formed, the structure becomes simple, manufacturing becomes easy and manufacturing cost can be also reduced.

By contrast with this, when the diameters of the suction routes are large, the pressure distribution in the depressurizing chamber 36 becomes non-uniform, and the gas cannot be uniformly suctioned on the entire surface of the porous plate 32. More specifically, a gas suction amount from the suction routes near the depressurizing through-holes 313 of the base 31 is large, and a gas suction amount from the suction routes distant from the depressurizing through-holes 313 of the base 31 becomes small.

Figure 17:
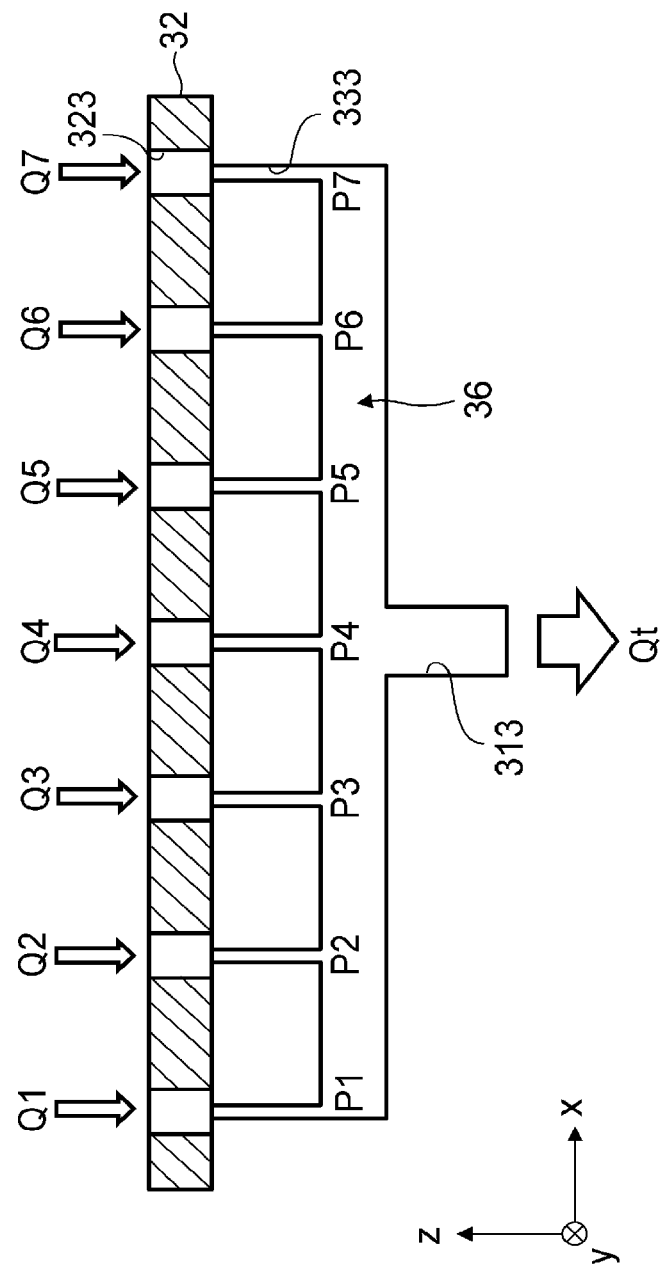
FIG. 17 is a cross-sectional view schematically illustrating the suction routes (the through-holes 323 of the porous plate 32 and the through-holes 333 of the intermediate plate 33), the depressurizing chamber 36 and the depressurizing through-hole 313.

A mechanism which can uniformly suction the gas on the entire surface of the porous plate 32 will be described in more detail with reference to FIG. 17. FIG. 17 is a cross-sectional view schematically illustrating the suction routes (the through-holes 323 of the porous plate 32 and the through-holes 333 of the intermediate plate 33), the depressurizing chamber 36 and the depressurizing through-hole 313. FIG. 17 omits the adhesive layer 34a and the pressurizing chamber 35.

To uniformly suction the gas on the entire surface of the porous plate 32, it is necessary to equalize gas flow rates Q1 to Q7 to be suctioned through the through-holes 323 of the porous plate 32. Therefore, when each one of the diameters of a plurality of formed suction routes (the through-holes 323 of the porous plate 32 and the through-holes 333 of the intermediate plate 33) is the same, it is necessary to equalize pressures P1 to P7 at opening ends of the through-holes 333 on a side of the depressurizing chamber 36.

Hence, in the flotation unit 30b according to the second embodiment, the diameters of the suction routes (the through-holes 323 of the porous plate 32 and the through-holes 333 of the intermediate plate 33) are reduced, and the resistances of the gas routes are increased. According to this configuration, a gas flow rate Qt to be exhausted from the depressurizing chamber 35 via the depressurizing through-holes 313 becomes significantly larger than a total of the gas flow rates Q1 to Q7 to be suctioned through the through-holes 323 of the porous plate 32. This is expressed as Qt>>Q1+Q2+Q3+Q4+Q5+Q+Q7 in a numerical expression. Hence, the pressure distribution in the depressurizing chamber 36 becomes uniform, and the pressure P1 to P7 become mutually equal. As a result, the gas flow rates Q1 to Q7 to be suctioned through the through-holes 323 of the porous plate 32 also become mutually equal. In addition, the diameters of the suction routes (the through-holes 323 of the porous plate 32 and the through-holes 333 of the intermediate plate 33) actually have machining variations, and therefore the gas flow rates Q1 to Q7 do not become completely equal, either, and vary more or less.

When diameter reduction of the above suction routes (the through-holes 323 of the porous plate 32 and the through-holes 333 of the intermediate plate 33) is performed, the diameters of the entire suction routes do not need to be reduced, and it is sufficient to reduce part of the diameters of the suction routes. In this regard, the porous plate 32 is preferably made of a ceramic from a viewpoint of durability improvement and particle suppression. In this case, it is difficult to make the diameters of the through-holes 323 small (e.g., 1 mm or less) due to a problem of machinability.

Hence, in the flotation unit 30b according to the second embodiment, the diameters of the suction routes are reduced by making the diameters of the through-holes 333 of the intermediate plate 33 made of a metal the small diameters and smaller than the diameters of the through-holes 323 of the porous plate 32 made of the ceramic. That is, the above gas flow rates Q1 to Q7 are determined based on the diameters of the through-holes 333 of the intermediate plate 33 having the smaller diameters, and machining variations of the diameters of the through-holes 333 of the intermediate plate 33 influence the gas flow rates Q1 to Q7.

To uniformly suction the gas on the entire surface of the porous plate 32, the diameters of the through-holes 333 of the intermediate plate 33 are preferably 1 mm or less, and are more preferably 0.5 mm or less. On the other hand, the diameters of the through-holes 323 of the porous plate 32 made of a ceramic are preferably, for example, 1 mm or more to make machining easy.

As described above, in the flotation unit 30b according to the second embodiment, the rising portion 312 protruding upward is formed at the outer periphery of the base 31, and the cutout portion 321 which fits to the rising portion 312 of the base 31 is formed along the outer periphery of the porous plate 32. Furthermore, the adhesive layer 34a is formed on the inner side along the inner wall of the rising portion 312 which has fitted to the cutout portion 321.

Generally, the cutout portion 321 of the porous plate 32 and the rising portion 312 of the base 31 are closely adhered, so that ultraviolet rays generated accompanying irradiation of the laser beam LB do not reach the adhesive layer 34a. If a gap is formed between the cutout portion 321 and the rising portion 312 and the ultraviolet rays enter through the gap, the ultraviolet rays hardly reach the adhesive layer 34a formed on the inner side of the rising portion 312 which has fitted to the cutout portion 321. Consequently, it is possible to effectively prevent deterioration of the adhesive layer 34a.

Furthermore, in the flotation unit 30b according to the second embodiment, the intermediate plate 33 is accommodated inside the base 31. Hence, the adhesive layer 34d which adheres the intermediate plate 33 to the base 31 is also accommodated inside the base 31. Consequently, it is possible to effectively prevent deterioration of the adhesive layer 34d.

Furthermore, the intermediate plate 33 is accommodated inside the base 31, so that it is possible to make the thickness (height) of the flotation unit 30b thin by at least the thickness t2 of the intermediate plate 33 compared to the comparative example illustrated in FIG. 10.

The invention invented by the inventors has been described above based on the embodiments above. However, the present invention is not limited to the above embodiments, and can be naturally changed variously without departing from the gist of the invention.

This application claims priority to Japanese Patent Application No. 2016-166962 filed on Aug. 29, 2016, the entire contents of which are incorporated by reference herein.

20 Reference Signs List
1 LASER IRRADIATION APPARATUS
10 LASER IRRADIATION UNIT
11 LASER OSCILLATOR
12 OPTICAL SYSTEM MODULE
20 LOCAL SEAL UNIT
30a, 30b FLOTATION UNIT
31 BASE
32 POROUS PLATE
32a, 32b SHORT POROUS PLATE 33 INTERMEDIATE PLATE p 34, 34a, 34b, 34c, 34d ADHESIVE LAYER
35 PRESSURIZING CHAMBER
36 DEPRESSURIZING CHAMBER
100 PLATE-SHAPED WORKPIECE
311 PRESSURIZING THROUGH-HOLE
312 RISING PORTION
DEPRESSURIZING THROUGH-HOLE
314 COUNTERBORED GROOVE
321 CUTOUT PORTION
323 THROUGH-HOLE
322a, 322b PROTRUSION PORTION
333 THROUGH-HOLE

The invention claimed is:

1. A laser irradiation apparatus comprising:
(a) a laser oscillator configured to emit a laser beam to be irradiated on a workpiece of a plate shape; and
(b) a flotation unit configured to float the workpiece by blowing and suctioning a gas, and including:
(b1) a base including a pressurizing through-hole and a depressurizing through-hole formed therein;
(b2) a porous plate located on an upper surface of the base and including a plurality of first through-holes formed therein; and
(b3) an intermediate plate made of a metal located below the porous plate, accommodated inside the base and including a plurality of second through-holes formed therein, wherein
the intermediate plate is shorter along a conveyance direction than the porous plate and the base,
the porous plate is bonded to the base by a first adhesive layer, and the intermediate plate is bonded to the base by a second adhesive layer,
the porous plate is disposed facing the workpiece,
a pressurizing chamber configured to pressurize a gas is formed in a space between the porous plate and the intermediate plate,
a depressurizing chamber configured to depressurize the gas is formed in a space between the base and the intermediate plate,
the pressurizing through-hole is connected to the pressurizing chamber,
each of the plurality of first through-holes is connected with a corresponding one of the plurality of second through-holes,
the depressurizing through-hole and the second through-holes are connected to the depressurizing chamber,
the gas is blown through the pressurizing through-hole and a pore of the porous plate,
the gas is suctioned through the depressurizing through-hole, and the pluralities of first and second through-holes, and
diameters of the plurality of first through-holes are larger than diameters of the plurality of second through-holes.

2. The laser irradiation apparatus according to claim 1, wherein the porous plate is made of a ceramic.

3. The laser irradiation apparatus according to claim 1, wherein a number of the depressurizing through-hole connected to the depressurizing chamber is singular.

4. The laser irradiation apparatus according to claim 1, wherein
the workpiece is a substrate including an amorphous silicon film formed on an upper surface, and
the laser irradiation apparatus is an excimer laser annealing apparatus configured to irradiate the amorphous silicon film with the laser beam to polycrystallize.

5. The laser irradiation apparatus according to claim 3, wherein the singular depressurizing through-hole is formed at a center portion of the base.

6. The laser irradiation apparatus according to claim 1, wherein the plurality of first through-holes are connected with the plurality of second through-holes by adhesive layers of ring shapes.

7. The laser irradiation apparatus according to claim 1, wherein the porous plate is bonded to a first rising portion of the base extending upward at an outer periphery of the base, and the intermediate plate is bonded to a second rising portion of the base extending upward at the outer periphery of the base.

* * * * *